(12) United States Patent
Shim

(10) Patent No.: US 7,488,681 B2
(45) Date of Patent: Feb. 10, 2009

(54) METHOD FOR FABRICATING AL METAL LINE

(75) Inventor: Cheon Man Shim, Seoul (KR)

(73) Assignee: Dongbu Electronics Co., Ltd., Seoul (KR)

(*) Notice: Subject to any disclaimer, the term of this patent is extended or adjusted under 35 U.S.C. 154(b) by 173 days.

(21) Appl. No.: 11/504,827

(22) Filed: Aug. 14, 2006

(65) Prior Publication Data

US 2007/0037381 A1  Feb. 15, 2007

(30) Foreign Application Priority Data

Aug. 12, 2005  (KR)  .................. 10-2005-0074060

(51) Int. Cl.
*H01L 21/4763* (2006.01)

(52) U.S. Cl. .................. 438/627; 438/643; 438/688

(58) Field of Classification Search ................ 438/627, 438/643, 653, 660, 685, 688
See application file for complete search history.

(56) References Cited

U.S. PATENT DOCUMENTS

2003/0003719 A1* 1/2003 Lim et al. ............... 438/643

* cited by examiner

*Primary Examiner*—Kevin M Picardat
(74) *Attorney, Agent, or Firm*—Andrew D. Fortney

(57) ABSTRACT

Disclosed is a method for fabricating an Al metal line. The method includes forming an insulating layer on a semiconductor substrate; forming a Ti layer, a bottom TiN layer, an Al layer and a top TiN layer in successive order on the insulating layer; plasma-treating the top TiN layer; forming a photoresist pattern on the plasma-treated top TiN layer; and etching the plasma-treated top TiN layer, the Al layer, the bottom TiN layer, and the Ti layer using the photoresist pattern as an etching mask, thereby forming the Al metal line.

14 Claims, 7 Drawing Sheets

116

116a

METHOD FOR FABRICATING AL METAL LINE

This application claims the benefit of Korean Application No. 10-2005-0074060, filed on Aug. 12, 2005, which is incorporated by reference herein in its entirety.

BACKGROUND OF THE INVENTION

1. Field of the Invention

The present invention relates to a semiconductor device manufacturing technology. More specifically, the present invention relates to a method for fabricating an Al-containing metal line in a semiconductor device.

2. Description of the Related Art

Conventionally, metallization interconnection technologies are applied in fabrication of semiconductor devices, in order to electrically interconnect circuit elements and/or other metallization lines. As a material for metallization interconnection, various metal materials such as aluminum (Al), tungsten (W), and copper (Cu) have been used, and especially Al has been most widely used among these metal materials.

In formation of Al contacts in semiconductor devices, a TiN layer has been used as a typical metal barrier. A metal barrier for Al contacts can comprise a TiN single layer or a Ti—TiN bilayer. A TiN barrier or Ti/TiN barrier can be generally formed on a bottom or sidewall of a contact, using a physical vapor deposition (PVD) process.

Hereinafter, a conventional method for fabricating an Al metallization line will be explained in detail, referring to the following drawings.

FIGS. 1A to 1C are cross-sectional views illustrating processes for fabricating Al metallization lines, according to a conventional art, and FIG. 2 is a SEM (Scanning Electron Microscope) image illustrating a problem in the conventional art.

Referring to FIG. 1A, an insulating layer 2 (i.e., a $SiO_2$ layer) is formed on a semiconductor substrate 1 in which various circuit elements are previously formed, and then Ti and TiN layers 3 and 4 are formed in successive order on the insulating layer 2. After that, an Al layer 5 is formed on the TiN layer 4, and further another TiN layer 6 is formed on the Al layer 5. The TiN layer 6 functions as an anti-reflective coating to lower the reflection of light from the Al layer 5 during a photolithography process. In addition, the TiN layer 6 can be used as an etch stop layer during the process for forming a tungsten plug thereon.

As shown in FIG. 1B, a photoresist pattern 7 is formed on the TiN layer 6, using photolithography process, e.g., exposing and developing of a photoresist.

After that, as shown in FIG. 1C, the TiN layer 6, the Al layer 5, and Ti/TiN layer 3 and 4 are successively etched using the photoresist pattern 7 as an etching mask, thus forming Al metallization lines 10.

In the case of forming a single TiN layer (without a Ti layer) on the Al layer, as above described, a photoresist material can invade grain boundaries of the top TiN layer generally having a lamellar structure. Thus, a photoresist material can remain in the top TiN layer, even after the photolithography process. The remaining photoresist material may disturb patterning of the Al layer, thus resulting in a ring defect (referred to as A in FIG. 2) that represents non-etched Al material remaining between metal lines (referred to as ML in FIG. 2).

The ring defect A, abnormally interconnecting adjacent Al metal lines, may induce a failure of device operation.

For such reason, a Ti—TiN bilayer is generally used as a top metal barrier in formation of Al metal lines, wherein a top Ti layer can improve the adhesiveness and tolerance to electromigration (EM) of the Al layer. Especially, the top Ti layer can induce a crystal growth of Al in the direction of superior EM properties. Also, the top Ti layer can react with Al to form $TiAl_3$, thus preventing crystal growth of Al in the form of a bamboo structure (or hillock).

In addition, because the top TiN layer has a lamellar structure but the top Ti layer may have little or no crystallinity, a photoresist material can not invade beyond the top TiN layer (i.e., up to the Al layer), thus the Al layer can be patterned normally.

However, forming the additional top Ti layer can cause another problem where the electric resistivity of the Al metal line increases. Accordingly, it may be desirable to remove the top Ti layer on the Al layer. Yet, in the case of removing the top Ti layer, a photoresist material for a photolithography process can contaminate Al metal lines, resulting in unwanted interconnection of neighboring metal lines.

In order to overcome such problems, especially the unwanted interconnection problem of metal lines, forming a $SiO_2$ layer on the top TiN layer and then patterning the Al layer has been conventionally used.

Still, the patterning efficiency and gap-fill property of the Al layer may deteriorate due to the $SiO_2$ layer. Particularly, voids may occur between metal lines. Accordingly, total processing margins may become insufficient, thus resulting in process control difficulties and productivity reduction.

SUMMARY OF THE INVENTION

It is, therefore, an object of the present invention to provide a method for fabricating an Al line in a semiconductor device, wherein a top TiN layer as a metal barrier is plasma-treated to reform sparse crystalline structures (e.g., gaps) at grain boundaries in the TiN layer, thus enabling densification of the crystalline structure at grain boundaries.

To achieve the above object, an embodiment of a method for fabricating an Al line, according to the present invention, comprises the steps of: forming an insulating layer on a semiconductor substrate; forming a Ti layer, a bottom TiN layer, an Al layer and a top TiN layer in successive order on the insulating layer; plasma-treating the top TiN layer; forming a photoresist pattern on the plasma-treated top TiN layer; etching the plasma-treated top TiN layer, the Al layer, the bottom TiN layer, and the Ti layer using the photoresist pattern as an etching mask, thereby forming the Al metal line.

DETAILED DESCRIPTION OF THE INVENTION

Hereinafter, a preferred embodiment of the present invention will be described in detail, referring to the following drawings.

FIGS. 3A to 3F are cross-sectional views illustrating a method for fabricating an Al metal line in a semiconductor device, according to the present invention.

Figure 1A:
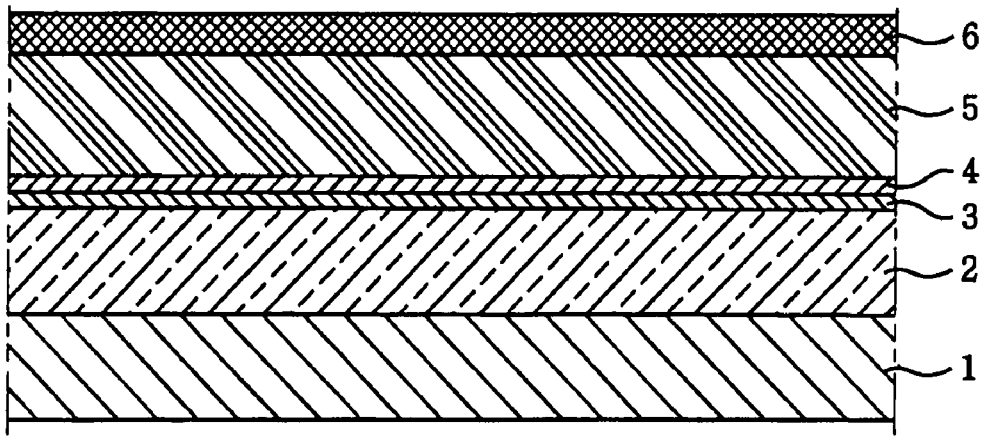
FIGS. 1A to 1C are cross-sectional views illustrating processes for fabricating Al metallization lines, according to a conventional art.
Figure 1B:
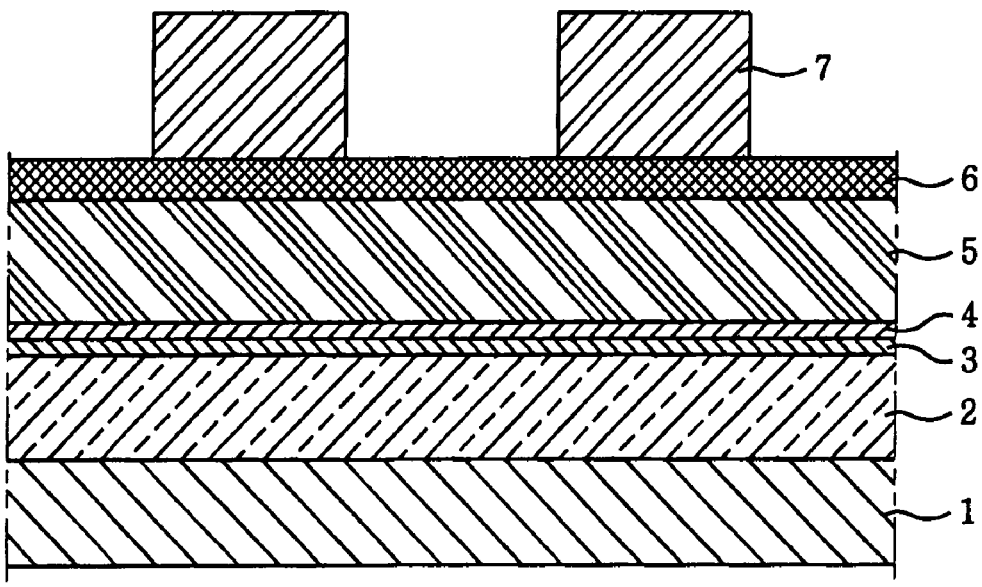
Figure 1C:
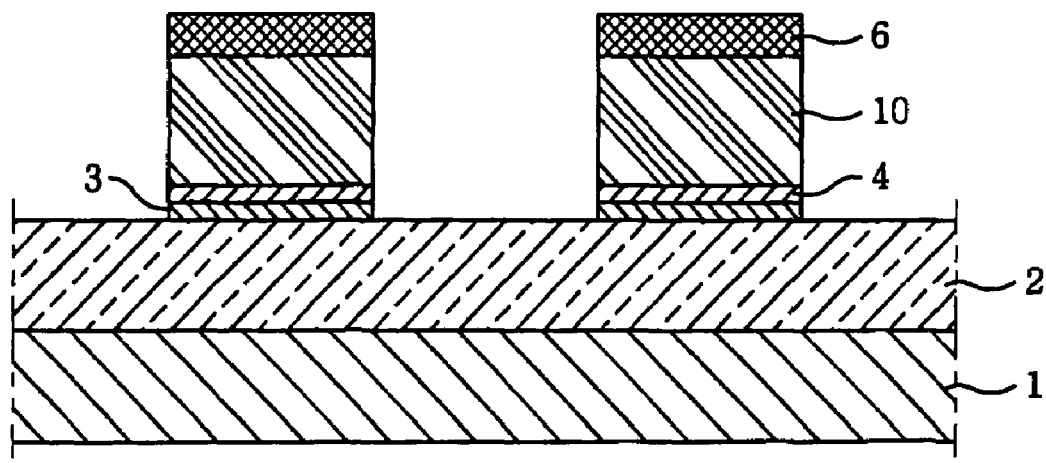
Figure 2:
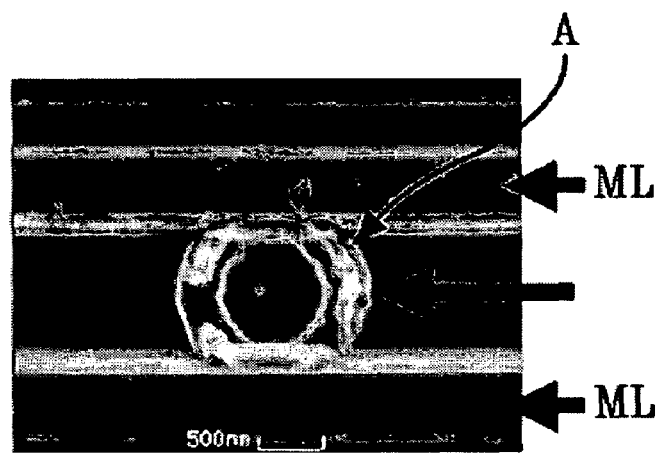
FIG. 2 is a SEM (Scanning Electron Microscope) image illustrating a problem in the conventional art.
Figure 3A:
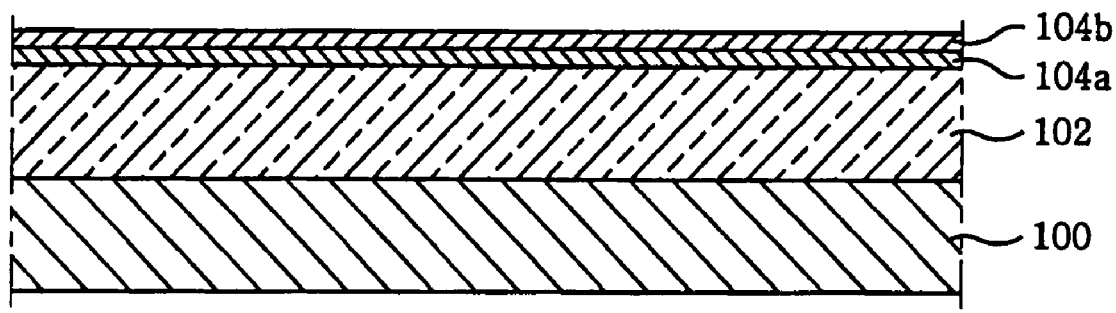
FIGS. 3A to 3E are cross-sectional views illustrating a method for fabricating an Al metal line in a semiconductor device, according to the present invention.

Referring to FIG. 3A, an insulating layer 102, using an insulating material such as $SiO_2$, is formed on a semiconductor substrate 100 using chemical vapor deposition (e.g., from a precursor comprising TEOS [$Si(OC_2H_5)_4$] or silane [$SiH_4$] and an oxygen source such as $O_2$, optionally in the presence of a plasma), and then Ti/TiN layers 104a and 104b are formed in successive order thereon.

Specifically, in formation of Ti/TiN layers 104a and 104b, Ar gas is injected into a processing chamber equipped with a Ti target, and the Ti layer 104a can be formed on a surface of the semiconductor substrate 100 by sputtering (e.g., Ar-sputtering). After the Ti layer 104 is formed in a desired thickness on the substrate 100, a nitrogen-(N-)-containing gas such as $N_2$ and/or $NH_3$ is injected along with Ar gas into the chamber, thus forming the TiN layer 104b.

Figure 3B:
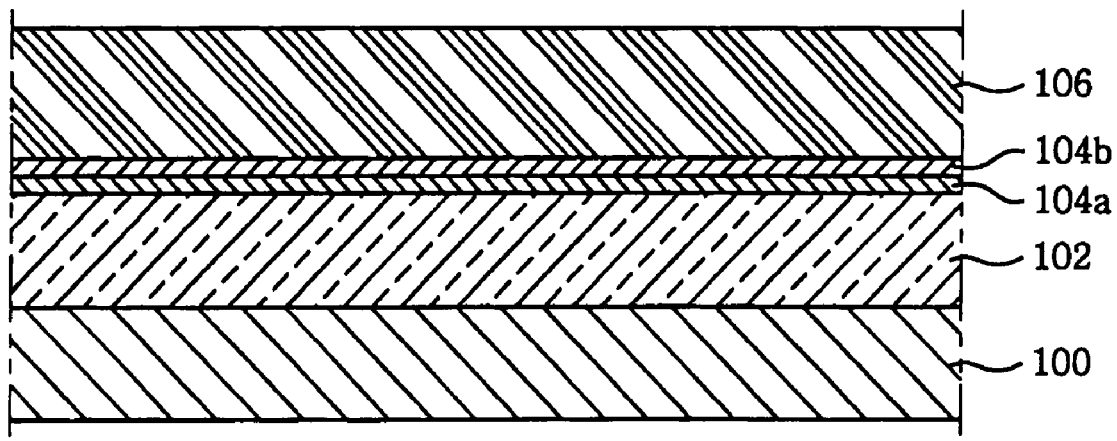

Referring to FIG. 3B, an Al metallization layer 106 is formed on a top surface of the TiN layer 104b, using a typical manner known to those skilled in the art, e.g., sputtering followed by a reflow process at 580° C. for 120 seconds.

Figure 3C:
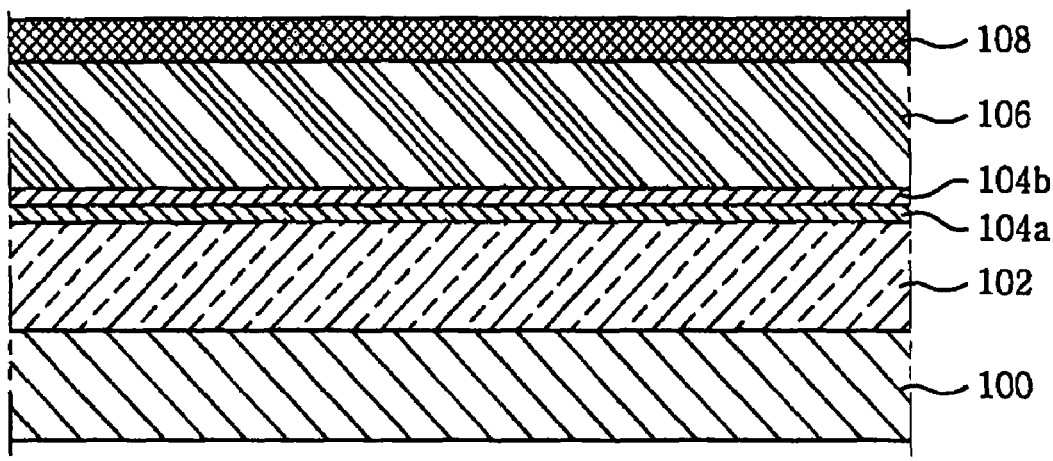
Figure 4A:
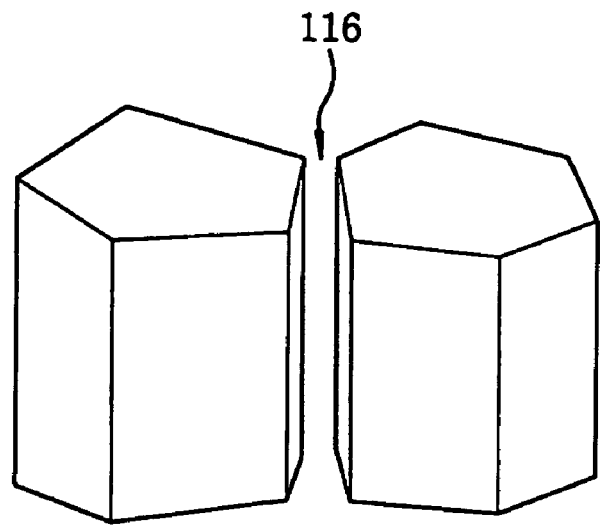
FIGS. 4A to 4B illustrate a sparse crystalline structure.

After that, as shown in FIG. 3C, a top TiN layer 108 is formed on the Al metallization layer 106. Here, the top TiN layer 108 on the Al layer 106, as shown in FIG. 4A, has a lamellar crystalline structure of which grain boundaries may be formed in a sparse crystalline structure containing gaps, generally on the order of a few to a few tens of Angstroms wide (hereinafter, referred to a sparse portion; see, e.g., spaces 116 between the lamellar grains shown in FIG. 4A).

Figure 3D:
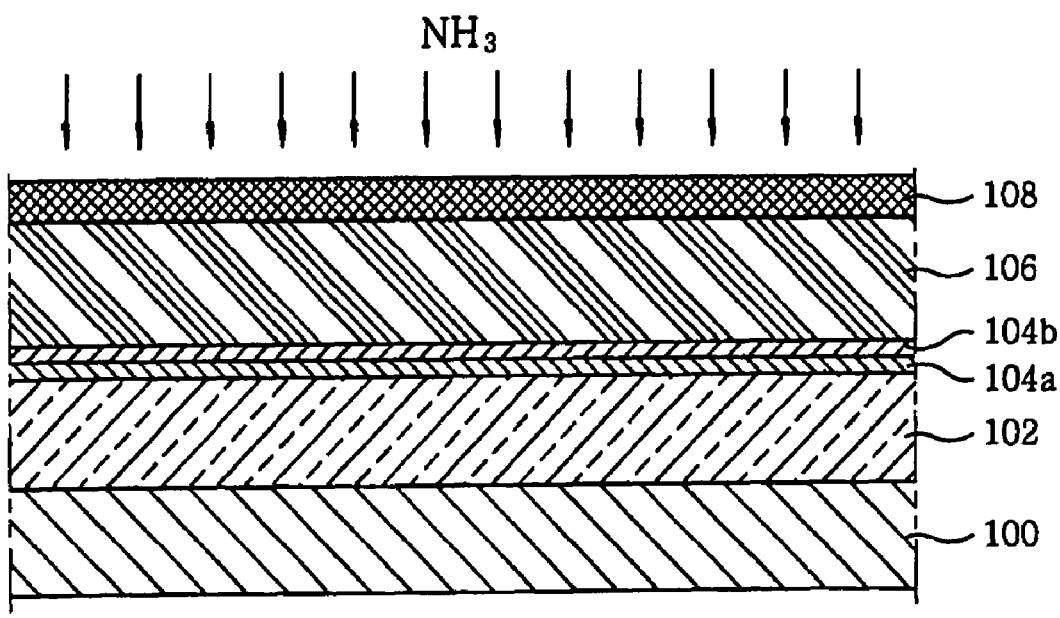
Figure 4B:
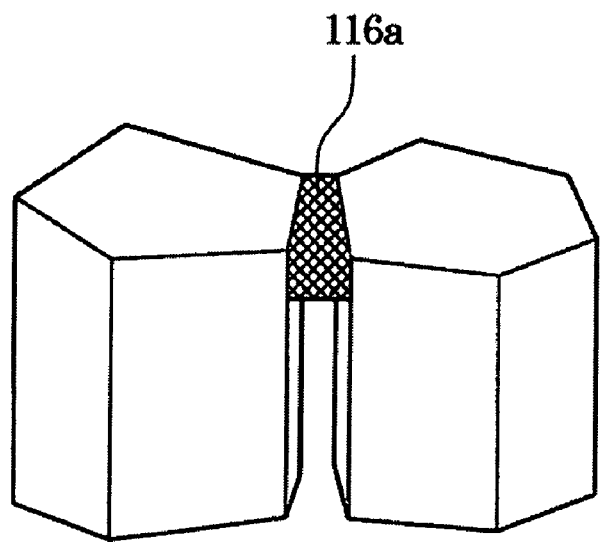

Subsequently, referring to FIG. 3D, the top TiN layer 108 is plasma treated using a nitrogen-containing gas (e.g., $NH_3$, $N_2$ [which may further contain $H_2$], $N_2H_4$, $HN_3$, $N_2$, NO or $N_2O$), in order to reform the crystalline structure at grain boundaries of the TiN layer 108. The nitrogen plasma generates further Ti—N bonds to densify the sparse portion 116 at grain boundaries. More specifically, as shown in FIG. 4B, the top TiN layer 108 is plasma-treated so that the sparse portion 116 at grain boundaries is activated and Ti—N bonds generates. Because of new Ti—N bonds at grain boundaries, the crystalline structure at grain boundaries can be densified so that the sparse portion 116 is reformed to a dense portion 116a.

Here, the plasma treatment of the top TiN layer 108 can be performed under conditions comprising a power of 100~2000 W, a pressure of 3 mTorr ~5 Torr, a $NH_3$ gas of 10~500 sccm, a $N_2$ gas of 100~2000 sccm, and a temperature of 20~420° C. Of course, one may select one or more of these conditions, and modify the others, as may be useful and/or desired for a particular manufacturing recipe or equipment set. For example, plasma treating may comprise exposing the top TiN layer to a plasma comprising one or more nitrogen-containing source gases from those described above, or to a plasma comprising a nitrogen source gas (e.g., not containing hydrogen, such as $N_2$, NO or $N_2O$) and a hydrogen-containing gas (but which may not contain oxygen and/or carbon, such as $NH_3$, $N_2H_4$, $HN_3$, or $H_2$). It is believed that hydrogen-containing species provide a more reactive form of nitrogen, without necessarily introducing species that (in sufficient amounts) may adversely affect the conductivity of the TiN, such as oxygen and/or carbon (although small amounts of oxygen and/or carbon in TiN generally does not significantly adversely affect its conductivity). Thus, the plasma may be further generated from nitrogen-containing gases such as HCN, HNCO, HOCN, methylamine, ethylamine, etc.

Because the sparse portion 116 is reformed to a relatively dense portion 116a at grain boundaries in the TiN layer 108 (see, e.g., FIG. 4B), invasion or diffusion of a photoresist material to the Al layer 106 during the subsequent photolithography process for forming Al metal lines can be prevented effectively.

Figure 3E:
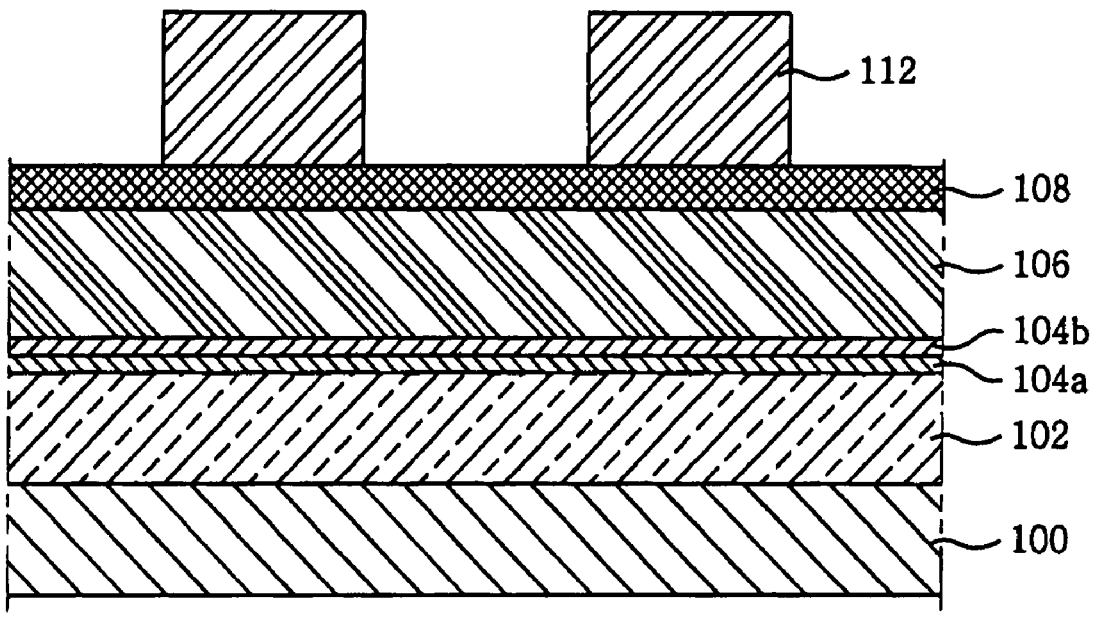

As shown in FIG. 3E, a photoresist pattern 112 is formed on the TiN layer 108 using a typical photolithography process including exposing and developing of a photoresist material.

Figure 3F:
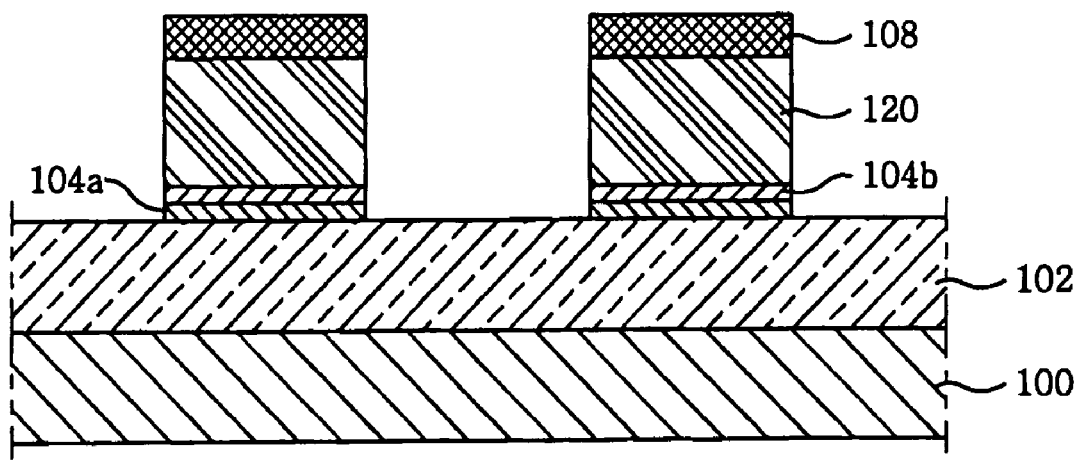

After that, referring to FIG. 3F, the TiN layer 108, the Al layer 106, Ti/TiN layer 104a and 104b are successively etched, using the photoresist pattern 112 as an etching mask, thus forming Al metal lines 120. Finally, the remaining photoresist pattern 112 is completely stripped.

As above described, in the present invention, the top TiN layer on the Al layer is plasma-treated so that sparse portions at grain boundaries is reformed to dense portions, thus preventing invasion of a photoresist material to the Al layer.

Furthermore, the present invention does not use a Ti layer as a top metal barrier and further a $SiO_2$ layer for removing an unnecessary Ti layer, thus enabling reduction of the resistivity of Al metal lines and obtainment of sufficient processing margin.

While the invention has been shown and described with reference to certain preferred embodiments thereof, it will be understood by those skilled in the art that various changes in form and details may be made therein without departing from the spirit and scope of the invention as defined by the appended claims.

What is claimed:

1. A method for fabricating an Al line, comprising the steps of:
   forming an insulating layer on a semiconductor substrate;
   forming a Ti layer, a bottom TiN layer, an Al layer and a top TiN layer having a crystalline structure, in successive order on the insulating layer;
   plasma-treating the top TiN layer to densify the crystalline structure of the top TiN layer;
   forming a photoresist pattern on the plasma-treated top TiN layer;
   etching the plasma-treated top TiN layer, the Al layer, the bottom TiN layer, and the Ti layer using the photoresist pattern as an etching mask, thereby forming the Al metal line.

2. The method of claim 1, wherein the plasma-treatment of the top TiN layer utilizes a nitrogen-containing gas.

3. The method of claim 2, wherein the nitrogen-containing gas comprises at least one of $NH_3$, $N_2$, and $N_2O$.

4. The method of claim 2, wherein the plasma-treatment is performed under conditions comprising a power of 100~200 W and a pressure of 3 mTorr~5 Torr.

5. The method of claim 1, wherein the top TiN layer is plasma-treated at a power of 100~200 W.

6. The method of claim 1, wherein the top TiN layer is plasma-treated at a pressure of 3 mTorr~5 Torr.

7. The method of claim 2, wherein the plasma-treatment is performed under conditions comprising $NH_3$ gas at a flow rate of 10~500 sccm and $N_2$ gas at a flow rate of 100~2000 sccm.

8. The method of claim 1, wherein plasma-treating the top TiN layer comprises exposing the top TiN layer to a plasma comprising a nitrogen source gas and a hydrogen-containing gas.

9. The method of claim 8, wherein the nitrogen source gas comprises at least one of $N_2$, $N_2O$ and NO.

10. The method of claim 8, wherein the hydrogen-containing gas comprises at least one of $NH_3$, $N_2H_4$, and $HN_3$.

11. The method of claim 8, wherein the hydrogen-containing gas comprises $NH_3$ gas at a flow rate of 10~500 sccm and the nitrogen source gas comprises $N_2$ gas at a flow rate of 100~2000 sccm.

12. The method of claim 2, wherein the plasma-treatment is performed at a temperature of 20~420° C.

13. The method of claim 2, wherein the nitrogen-containing gas comprises at least one of $NH_3$, $N_2$, $N_2O$, NO, $N_2H_4$, and $HN_3$.

14. The method of claim 13, wherein the nitrogen-containing gas comprises at least one gas containing nitrogen and at least one gas containing hydrogen.

* * * * *